United States Patent
Lin et al.

(10) Patent No.: US 10,163,626 B2
(45) Date of Patent: Dec. 25, 2018

(54) METAL GATE STRUCTURE AND MANUFACTURING METHOD THEREOF

(71) Applicant: TAIWAN SEMICONDUCTOR MANUFACTURING CO., LTD., Hsinchu (TW)

(72) Inventors: Ming-Huei Lin, New Taipei (TW); Yen-Yu Chen, Kaohsiung (TW); Chih-Pin Tsao, Hsinchu County (TW); Shih-Hsun Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/375,266

(22) Filed: Dec. 12, 2016

(65) Prior Publication Data

US 2018/0166274 A1 Jun. 14, 2018

(51) Int. Cl.
| | |
|---|---|
| *H01L 21/8234* | (2006.01) |
| *H01L 21/02* | (2006.01) |
| *H01L 29/06* | (2006.01) |
| *H01L 29/78* | (2006.01) |
| *H01L 29/66* | (2006.01) |
| *H01L 21/768* | (2006.01) |

(52) U.S. Cl.
CPC .... *H01L 21/02326* (2013.01); *H01L 29/0649* (2013.01); *H01L 29/6659* (2013.01); *H01L 29/66545* (2013.01); *H01L 29/7833* (2013.01); *H01L 21/76888* (2013.01)

(58) Field of Classification Search
CPC ................................................ H01L 21/76888

USPC ........................................... 438/648; 257/407
See application file for complete search history.

(56) References Cited

U.S. PATENT DOCUMENTS

| | | | |
|---|---|---|---|
| 7,563,678 B2* | 7/2009 | Koyama | ......... H01L 21/823835 257/E21.637 |
| 7,612,422 B2 | 11/2009 | Chambers et al. | |
| 8,487,378 B2 | 7/2013 | Goto et al. | |
| 8,643,113 B2* | 2/2014 | Chambers | ......... H01L 21/28088 257/338 |
| 8,691,681 B2* | 4/2014 | Hsu | ................. H01L 21/823842 257/288 |

(Continued)

OTHER PUBLICATIONS

L.-Å. Ragnarsson et al., "Zero-thickness Multi Work Function Solutions for N7 bulk FinFETs"., Symposium on VLSI Technology Digest of Technical Papers., IEEE., 2016., p. 98-99.

(Continued)

*Primary Examiner* — Chandra Chaudhari
(74) *Attorney, Agent, or Firm* — McClure, Qualey & Rodack, LLP

(57) ABSTRACT

An NMOS transistor gate structure includes at least one spacer defining a gate region over a semiconductor substrate, a gate dielectric layer disposed on the gate region and lining an inner sidewall of the spacer, a bottom barrier layer conformally disposed on the gate dielectric layer, a work function metal layer disposed on the bottom barrier layer, and a filling metal partially wrapped by the work function metal layer. The bottom barrier layer has an oxygen concentration higher than a nitrogen concentration. The bottom barrier layer is in direct contact with the gate dielectric layer. The bottom barrier layer includes a material selected from Ta, TaN, TaTi, TaTiN and a combination thereof.

20 Claims, 13 Drawing Sheets

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 2014/0282326 A1 | 9/2014 | Chen et al. |

OTHER PUBLICATIONS

Ma Xueli et al., "An effective work-function tuning method of nMOSCAP with high-k/metal gate by TiN/TaN double-layer stack thickness"., Journal of Semiconductors., Sep. 2014., vol. 35, No. 9., p. 096001-1-096001-4.

* cited by examiner

METAL GATE STRUCTURE AND MANUFACTURING METHOD THEREOF

BACKGROUND

N-channel metal oxide semiconductor (NMOS) transistors have been frequently used in advanced complementary metal oxide semiconductor (CMOS) technology. It is important to modulate the effective work function in the metal gates of the NMOS transistors.

Conventional approach is to dispose multiple layers of work function metal films in the metal gates. In order to achieve different work function in different metal gates, very often, more than one work function metal film is used. The thickness of the metal gates therefore increases and varies according to the function of the metal gates. The increased thickness in metal gates is not desired in device scaling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
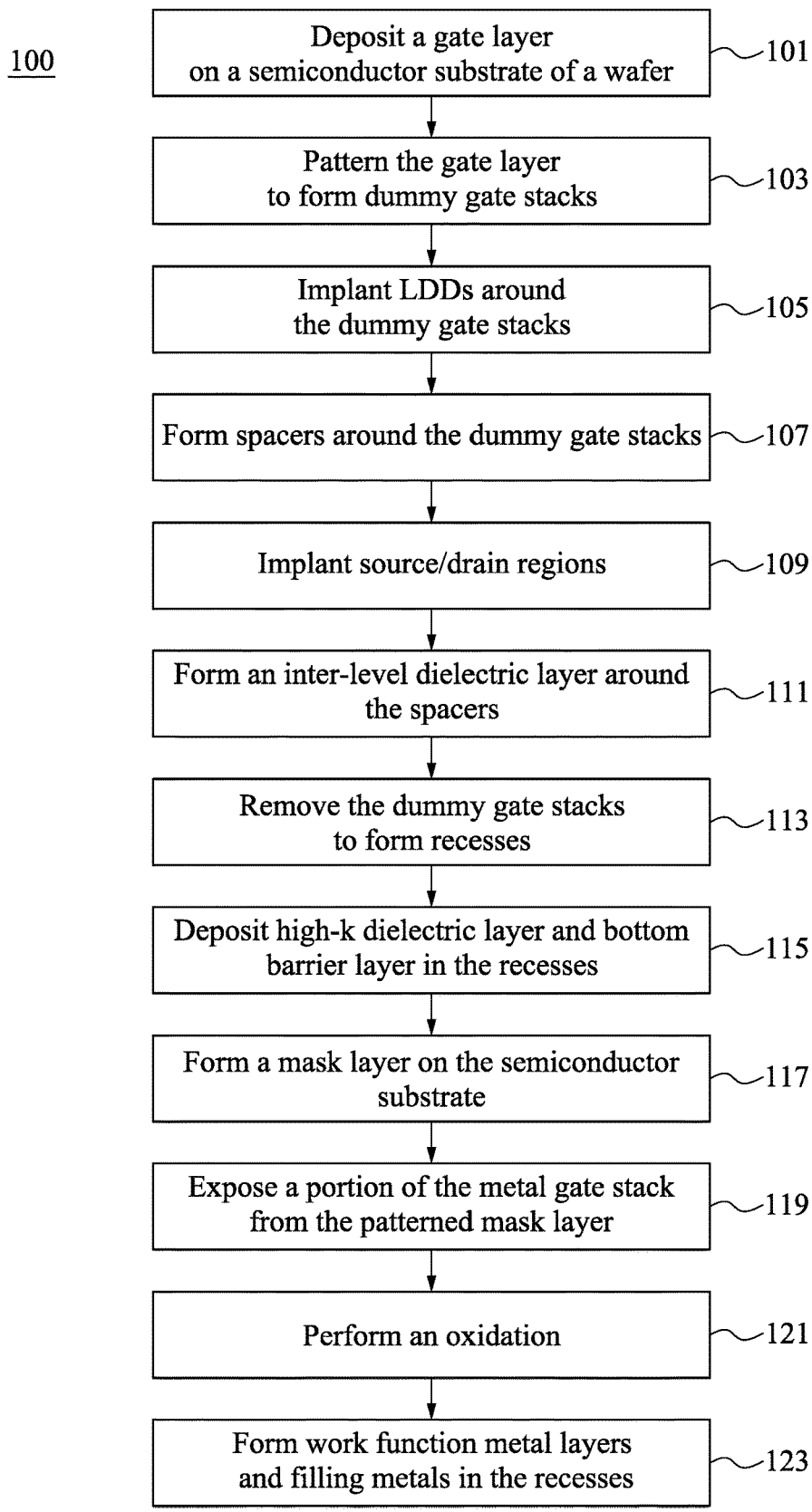
FIG. 1 is a flow chart illustrating a method of manufacturing metal gate structure in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating a metal gate structure in accordance with some exemplary embodiments of the instant disclosure. The method begins with operation 101 in which a gate layer is formed on a semiconductor substrate of a wafer. The method continues with operation 103 in which dummy gate stacks are formed by patterning the dummy gate layer. Subsequently, operation 105, lightly-doped drain and source (LDD) regions are formed in the semiconductor substrate. The method continues with operation 107 in which spacers are formed around the dummy gate stack. The method continues with operation 109 in which source and drain regions are formed in the semiconductor substrate. The method continues with operation 111 in which an inter-level dielectric (ILD) layer is formed around the spacers. Next, operation 113, the dummy gate stacks are removed to form recesses. The method continues with operation 115 in which high-κ dielectric layer and bottom barrier layer are deposited in the recesses. Following that, operation 117, a mask layer is formed on the semiconductor substrate. In operation 119, a portion of the metal gate stack is exposed from the patterned mask layer. The method continues with operation 121 in which an oxidation is performed. Next, in operation 123, work function metal layers and metal gates are formed.

Figure 2:
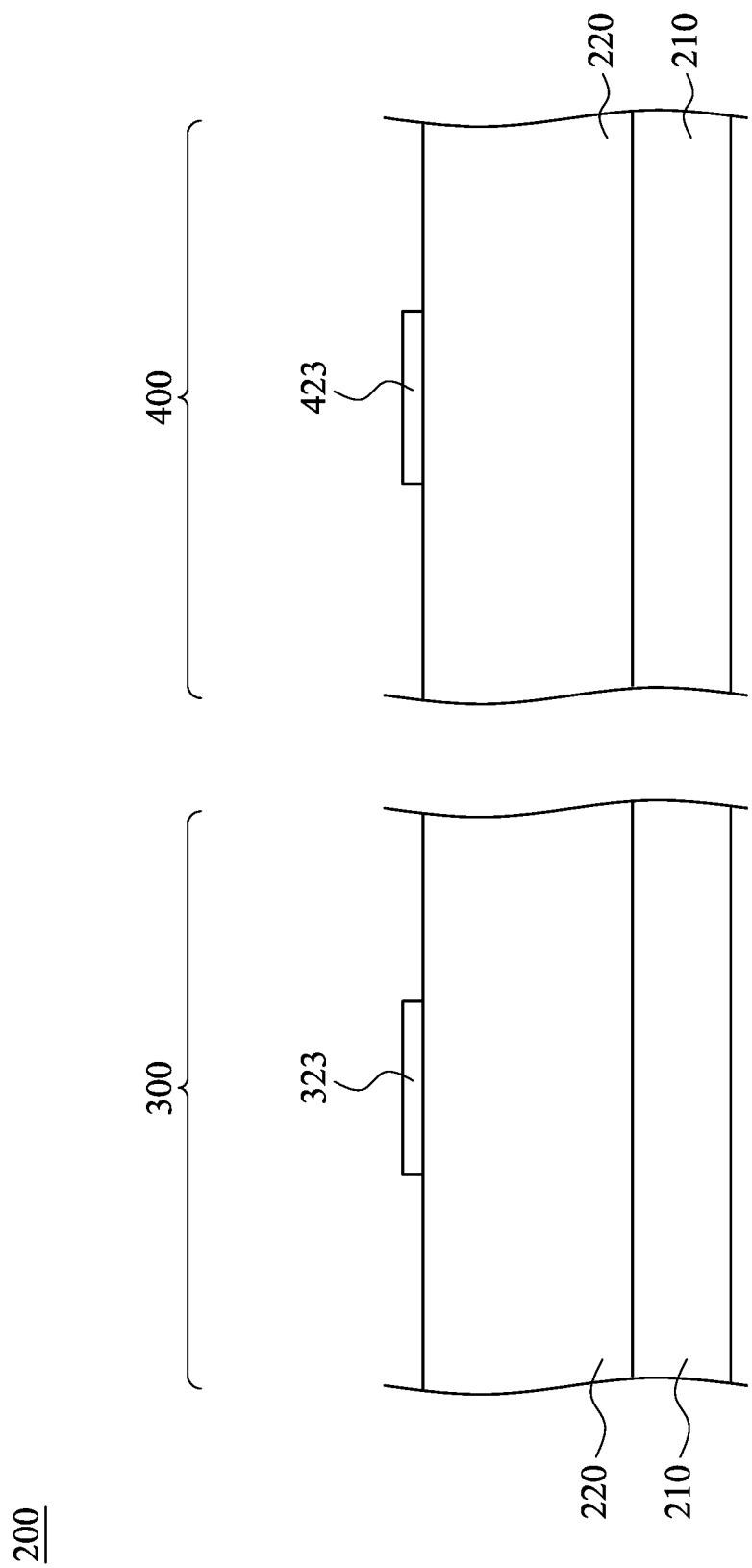
FIGS. 2-13 are cross-sections of a method for manufacturing a metal gate structure at various stages in accordance with some embodiments of the instant disclosure.

FIGS. 2 to 13 are cross-sectional views of a method of manufacturing a metal gate structure at various stages in accordance with some embodiments of the present disclosure. Reference is made to FIG. 2. A wafer 200 is provided. The wafer 200 is a semiconductor device at an intermediate stage of manufacture. The wafer 200 includes a semiconductor substrate 210. The semiconductor substrate 210 may be a semiconductor substrate, including silicon, germanium, silicon germanium, gallium arsenide (GaAs) or other appropriate semiconductor materials. Alternatively, the semiconductor substrate 210 may include an epitaxial layer (not shown). Furthermore, the semiconductor substrate 210 may be strained for performance enhancement. Alternatively, the semiconductor substrate 210 may include a semiconductor-on-insulator (SOI) structure such as a buried dielectric layer. Also alternatively, the semiconductor substrate 210 may include a buried dielectric layer such as a buried oxide (BOX) layer, such as that formed by a method referred to as separation by implantation of oxygen (SIMOX) technology, wafer bonding, selective epitaxial growth (SEG), or other appropriate methods. The semiconductor substrate 210 may also include a fin structure of a fin-like field-effect transistor (FinFET) formed by suitable processes, such as lithography patterning process and etching process. Various embodiments may include any of a variety of substrate structures and materials.

The semiconductor substrate 210 also includes various doped regions (not shown) formed by implantation techniques. For example, region 300 of the semiconductor substrate 210 is doped to form an N-type region and an N-well where a p-channel device will be fabricated. Similarly, region 400 of the semiconductor substrate 210 is doped to form a P-type region and a P-well where an n-channel device will be fabricated. The doped regions are doped with P-type dopants, such as boron or $BF_2$, and/or N-type dopants, such as phosphorus or arsenic. The doped regions may be formed directly on the semiconductor substrate 210, in a P-well structure, in an N-well structure, in a dual-well structure, or using a raised structure. It should be understood that the regions 300 and 400 may not be adjacent to each other. For the sake of clarity and simplicity, the two regions 300 and 400 are put together for illustration purpose. The regions 300 and 400 may be separated apart by other features not shown in the figure.

Optionally, an interfacial layer (not shown) of silicon oxide can be formed by a suitable process including chemical oxidation, for example, by treating the semiconductor substrate 210 with hydrofluoric acid (HF) immediately prior to depositing the gate layer 220. Another process for the silicon oxide interfacial layer is to thermally grow the interfacial layer followed by a controlled etch to provide the desired layer thickness.

Still referring to FIG. 2, gate layer 220, such as polysilicon, are disposed on the substrate 110 by deposition techniques known in the art. Alternatively, an amorphous silicon layer may optionally be formed instead of the polysilicon layer. Patterned hard masks 323, 423 are formed on the gate layer 220. The patterned hard masks 323, 423 include silicon nitride and/or silicon oxide, or alternatively photoresist. The patterned hard masks 323, 423 may include multiple layers. The patterned hard masks 323, 423 are patterned by a photolithography process and an etching process.

Figure 3:
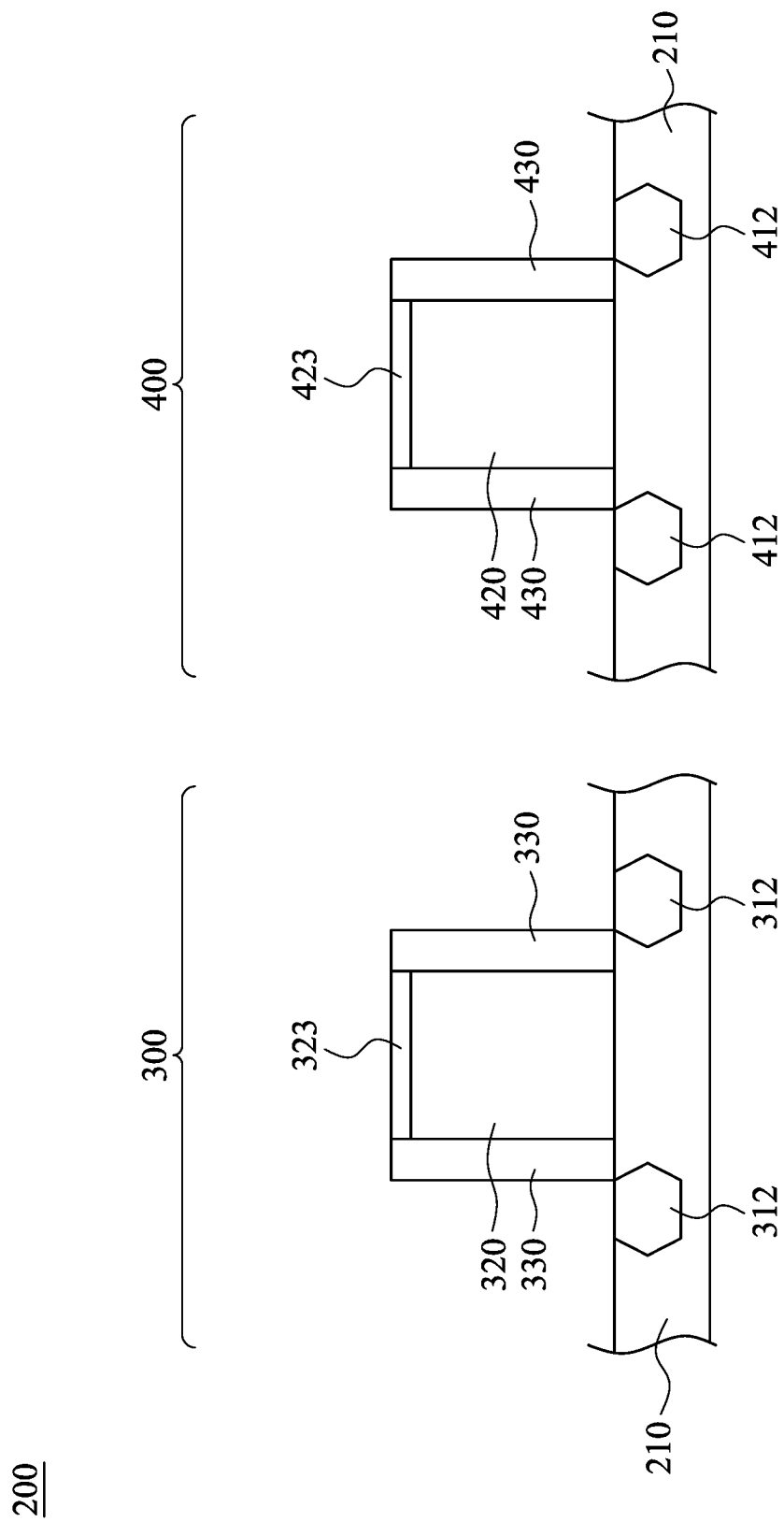

Reference is made to FIG. 3. By using the patterned hard masks 323, 423 of FIG. 2 as an etch mask, an etching process is applied to form dummy gate stacks 410, 410. The dummy gate stacks 410, 410 include dummy gates 320, 420 patterned from the gate layer 220 shown in FIG. 2. The etching process includes a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile. An ion implantation process is performed to form lightly doped drain (LDD) regions (not shown). The dummy gate stacks 410, 410 are used as masks to help control the implant profile and distribution.

Still referring to FIG. 3, after the dummy gate stacks 310, 410 are formed, sidewall spacers 330, 430 are formed on the sidewalls of the dummy gate stacks 310, 410. The sidewall spacers 330, 430 may include a dielectric material such as silicon oxide, silicon nitride, silicon carbide, silicon oxynitride, low-k material, air (spacer) or any other suitable material. In some embodiments, a process for etching the dummy gate stacks 310, 410 includes a plasma etch. Reactive gases can interact with the wafer 200 during plasma etching to produce volatile by products that subsequently redeposit on nearby surfaces. This can result in the formation of an optional passivation layer (not shown) on sidewalls of the dummy gate stacks 310, 410 respectively. The optional passivation layers can be silica or a similar material such as a silicate. Then the sidewall spacers 330, 430 are formed on the passivation layers. The sidewall spacers 330, 430 may be formed by deposition and etch processes known in the art.

Still referring to FIG. 3, source/drain regions 312, 412 are formed after the spacers 330, 430 are formed. The source/drain regions 312, 412 are formed in the semiconductor substrate 210. In the embodiments where the dummy gate stack 310 is used to form a p-channel metal oxide semiconductor field effect transistor (pMOS) device, the source/drain regions 312 of p-type. In the embodiments where the dummy gate stack 410 is used to form an n-channel metal oxide semiconductor field effect transistor (nMOS) device, the source/drain regions 412 are of n-type. The formation of source/drain regions 312, 412 may be achieved by etching the semiconductor substrate 110 to form recesses therein, and then performing an epitaxy to grow the source/drain regions 312, 412 in the recesses.

Figure 4:
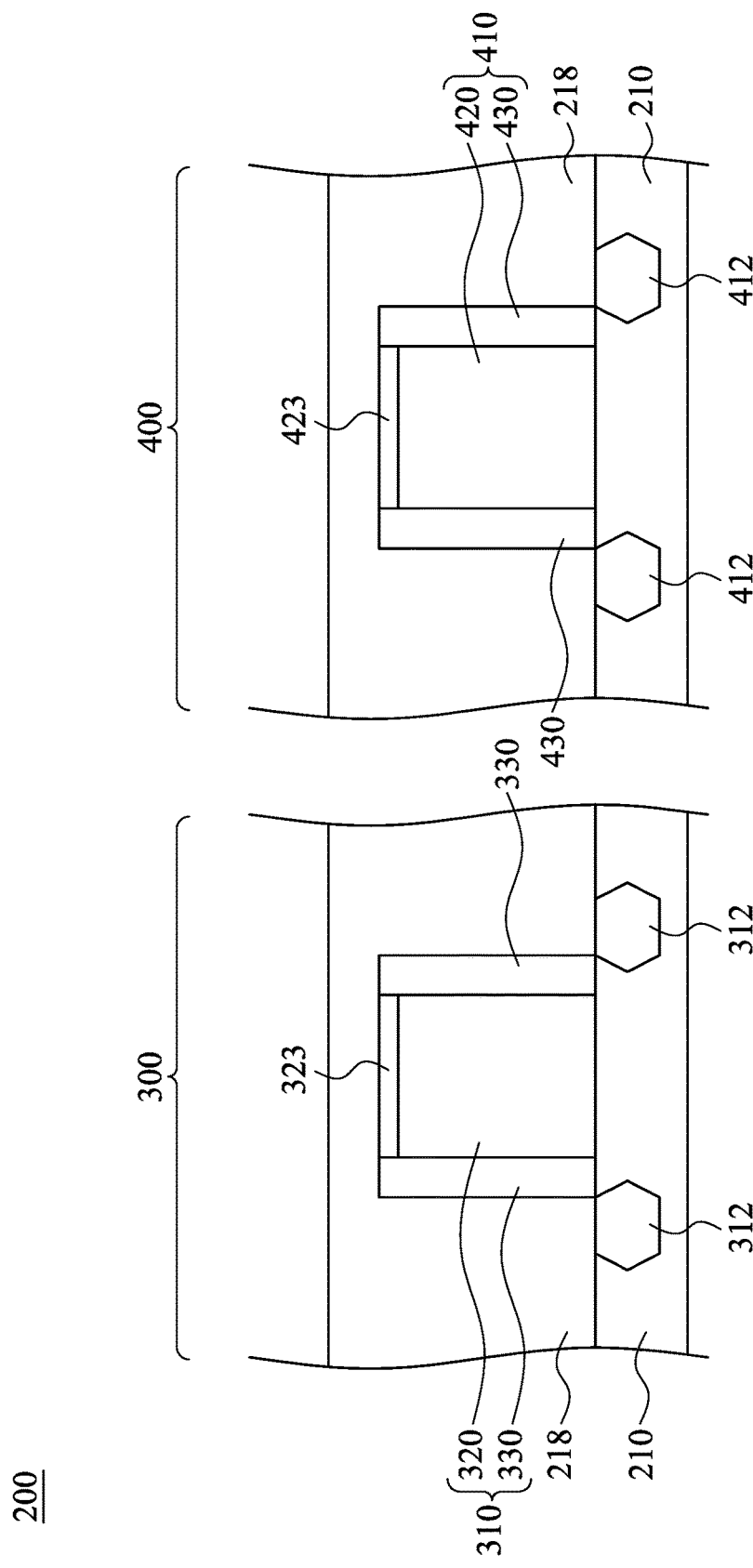

Reference is made to FIG. 4. An inter-level dielectric (ILD) layer 218 is formed. The ILD layer 218 is around the dummy gate stacks 310, 410 and adheres well to the spacers 330, 430 and over the top of the hard mask layers 323, 423.

Figure 5:
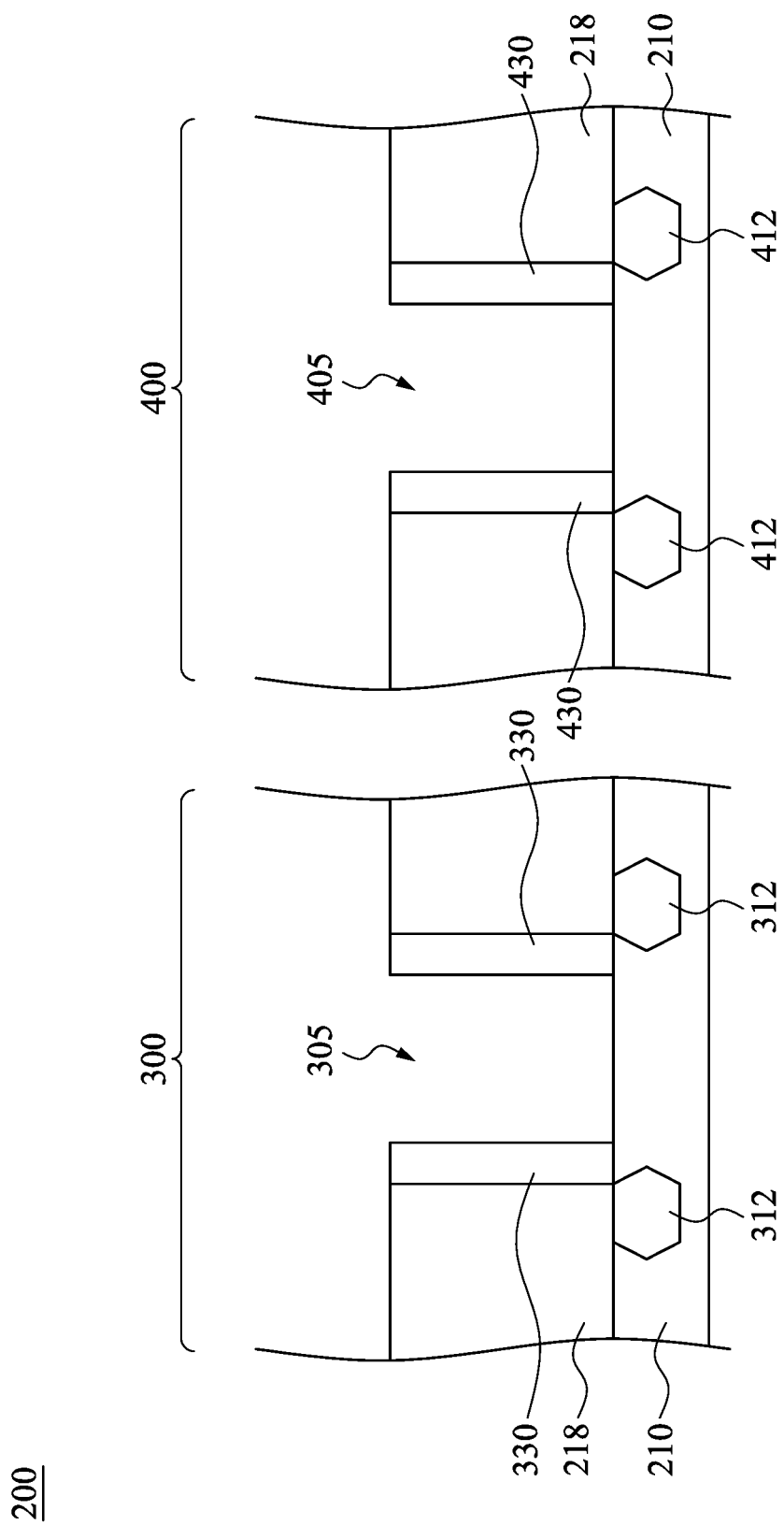

Reference is made to FIG. 5. Recesses 305 and 405 are formed. After the ILD layer 218 is formed, an upper surface of the wafer 200 is planarized to lower the surface to the level of the dummy gate stacks 310 and 410. The planarization is accomplished by, for example, chemical mechanical polishing (CMP). After planarizing, the patterned hard mask layers 323, 423 are removed, and the dummy gate layers 320 and 420, the spacers 330 and 430, and the ILD layer 218 all approximately have the same height. The dummy gate layers 320 and 420 are removed in one or many etch operations including wet etch and dry etch. According to various embodiments, a hard mask is patterned over the wafer 200 to protect the ILD layer 218 and the spacers 330 and 430. In some embodiments, a first etch process breaks through native oxide layers on the dummy gate layers 320 and 420, and a second etch process reduces the thickness of the dummy gate layers 320 and 420. The dummy gate layer etch stop at the interfacial layers or the semiconductor substrate 110 below. After gate layers 320, 420 removal, recesses 305, 405 are formed for accommodating metal gates.

Figure 6:
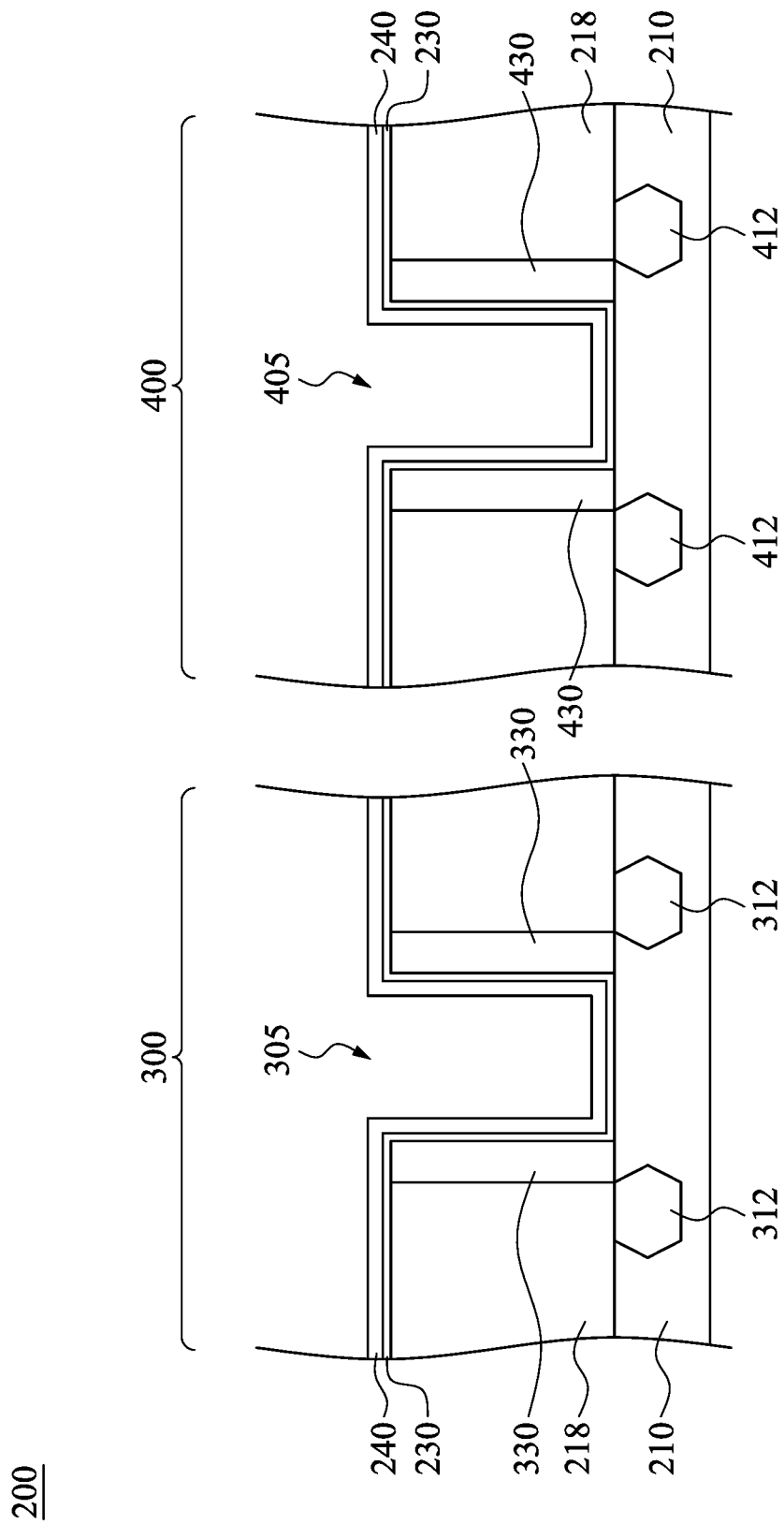

Reference is made to FIG. 6. High-κ dielectric layer and bottom barrier layer are formed in the recess. A high-κ dielectric layer 230 is conformally formed in the recesses 305, 405. In some embodiments, another interfacial layer is deposited first if the interfacial layer is removed in a previous process step. The high-κ dielectric layer 230 may include $HfO_x$, $HfLaO_x$, $HfZrO_x$, oxynitrides (SiON), $SiO_x$, or other suitable materials, where x is an integral. The high-κ dielectric layer 230 is deposited by suitable techniques, such as atomic layer deposition (ALD), chemical vapour deposition (CVD), physical vapour deposition (PVD), thermal oxidation, combinations thereof, or other suitable techniques.

Still referring to FIG. 6. A bottom barrier layer 240 is deposited in the recesses 305, 405 over the high-κ dielectric layer 230, the bottom barrier layer 240 is in direct contact with the high-κ dielectric layer 230. The bottom barrier layer 240 is formed in the recesses 305 and 405 and follows the contour created by the bottom surfaces and sidewalls of the recesses 305 and 405 and top surfaces of the spacers 330 and 430 and the ILD layer 218. A cross-section of the bottom barrier layer 240 may resemble a shape of U. The bottom barrier layer 240 may include Ta, TaN, TaTi and/or TaTiN. In some embodiments, a gate first process may also be adapted to form the gate structure, and the bottom barrier layer 240 is deposited in the recesses 305 and 405 but not in the shape of U. When the gate first process is employed, the bottom barrier layer 240 does not wrap around the work function metal layer, which is formed in a later stage.

Figure 7:
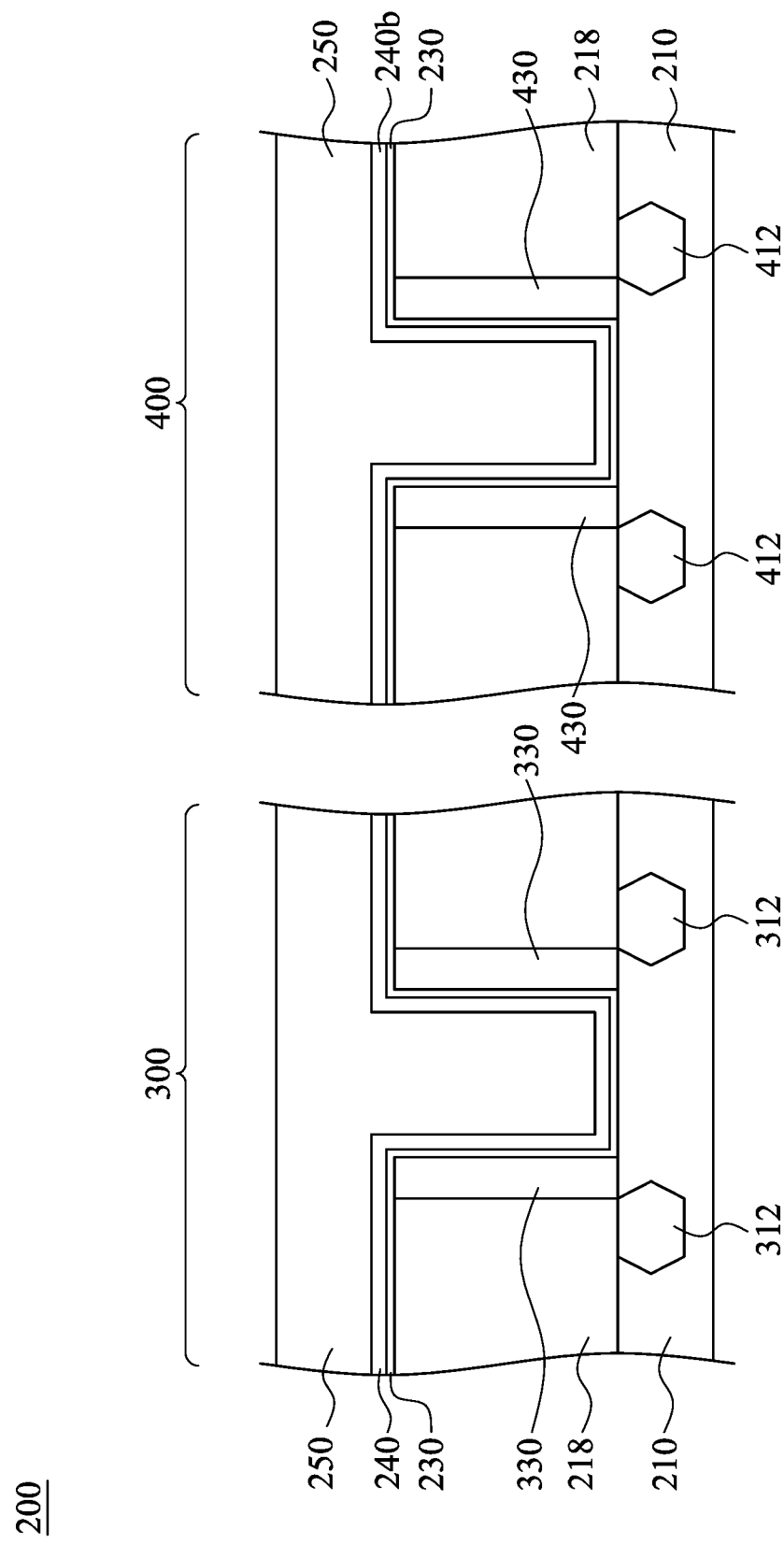

Reference is made to FIG. 7. A mask layer 250 is deposited on the semiconductor substrate 210. The mask layer 250 fills in the recesses 305 and 405 shown in FIG. 6 and covers up the entire bottom barrier layer 240 on the top surfaces of the spacers 330, 430 and the ILD layer 218.

Figure 8:
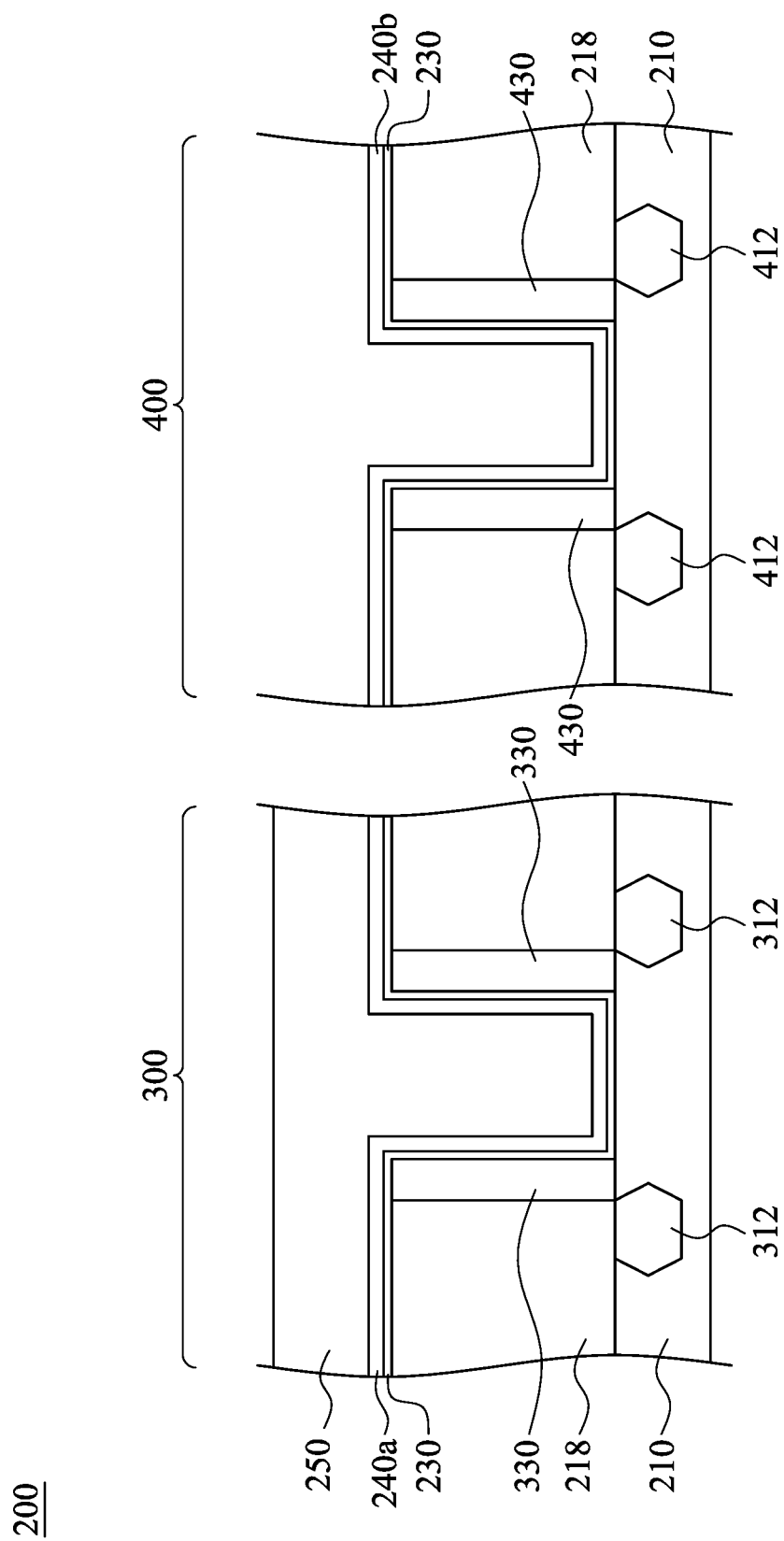

Reference is made to FIG. 8. The region 400 is exposed. A first etching, for example, dry etching, is performed to pattern the mask layer 250. The mask layer 250 covering the region 400 is removed from the recess 405 and the surface of the bottom barrier layer 240b. The remaining patterned mask layer 250 covers the region 300 with its underlying components, including bottom barrier layer 240a. The bottom barrier layer 240b on the region 400 is exposed without the protection of the mask layer 250.

Figure 9:
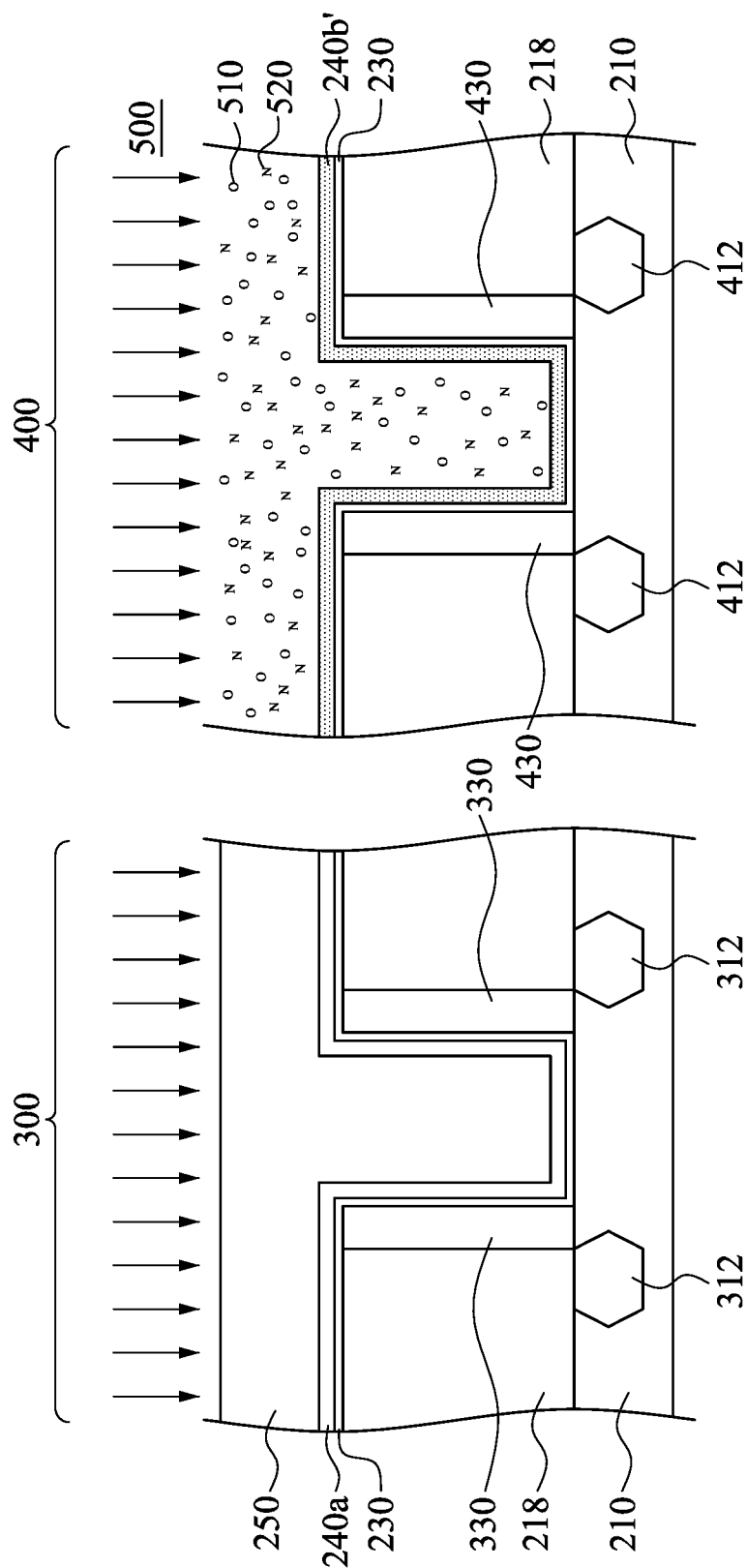

Reference is made to FIG. 9. Oxidation 500 is performed on the bottom barrier layer 240b. In order to balance low power consumption and high performance, the wafer 200 offers a mixture of devices ranging from high performance to ultra-low power, like regions 300 and 400, for which transistor off-state leakage span many orders of magnitude. This $I_{off}$ is often achieved by tuning the threshold voltage ($V_T$) of the devices to enable a variety of $V_T$ values. Shrinking channel dimensions implies multiple work function (multi-WF) gate stacks being more challenging due to reducing volume in the gate trench. As a result, the available space for effective work function tuning is very small. Hence, conformal zero-thickness modulation is highly desirable.

In order to modify the effective work function of the bottom barrier layer 240b without increasing the volume different approaches are used. In some embodiments, a chemical solution is used to treat the bottom barrier layer 240b. The chemical solution contains oxidizing agent and ammonium ions. The oxidizing agent may be, for example, $H_2O_2$, or acid with $ClO_3^-$, $ClO^-$, or $NO_3^-$. When $H_2O_2$ is used, the $H_2O_2$ accounts for 1-30 wt % of the chemical solution. The solvent may be, for example, water. When acid with $ClO_3^-$, $ClO^-$, or $NO_3^-$ is used, the concentration of the acid accounts for at least 1 wt % of the chemical solution. The ammonium ions include, for example, $NH_4^+$ and $NH_3$.

Still referring to FIG. 9. The bottom barrier layer 240b is treated with the chemical solution in a period of a few seconds at low temperature, for example, approximately 30 seconds at ambient temperature. The reaction temperature is lower than 150° C. The chemical solution may be sprayed onto the wafer. Alternatively, the wafer may be soaked in the chemical solution. Oxygen atoms (O) 510 and nitrogen atoms (N) 520 are provided by the chemical solution and diffuse in to the bottom barrier layer 240b in the recess 405 and on the top surface of the inter-level dielectric layer 218. The distribution of the oxygen atoms in the bottom barrier layer 240b may have a concentration between approximately $1 \times 10^{18}$ to $1 \times 10^{21}$ atoms/cm$^3$. The distribution of the nitrogen atoms in the bottom barrier layer 240b may have a concentration between approximately $1 \times 10^{18}$ to $1 \times 10^{21}$ atoms/cm$^3$. After oxidation, the nitrogen and oxygen concentration in the bottom barrier layer 240b is approximately 5% higher than the nitrogen and oxygen concentration in the bottom barrier layer 240a. Furthermore, the oxygen concentration is higher than the nitrogen concentration in the bottom barrier layer 240b. This oxidation process allows modulation of the effective work function of the bottom barrier layer 240b without increasing the thickness of the bottom barrier layer.

More specifically, the tantalum from the bottom barrier layer 240b and oxygen from the chemical solution form a Ta—O dipole layer between the high-κ dielectric layer 230 and the metal layer that will be formed in a later stage. The Ta—O dipole has a positive impact on the change of the effective work function. This oxygen infused bottom barrier layer 240b' can have an elevation of $V_T$ by at least 30 meV.

In some embodiments, the oxidation 500 may be performed in two stages. For example, a first chemical solution contains oxidizing agent, and the wafer is treated as previously discussed. Subsequently, a second chemical solution contains ammonium ions is used to treat the wafer. The second chemical solution includes 1-30 wt % of ammonium ions, and the solvent may be water. The second chemical solution can be sprayed on the wafer, or the wafer may be soaked in the second chemical solution. The wafer is treated at ambient temperature for at least 60 seconds.

In some embodiments, the two-stage oxidation process involves exposure to a plasma containing oxygen and then the treatment with a chemical solution containing ammonium ions. The plasma is formed in a gas mixture at a predetermined pressure. A flow of oxygen gas is introduced into the plasma in a plasma chamber which accommodates the wafer 200. The plasma includes oxygen radical. Examples of the oxygen radical includes $O_3$, $O_2^+$, $O^+$, $O_2^-$, O, $O^-$. The plasma may also contain an inert gas such as argon. The reaction pressure ranges between 0.01 to 1 Torr, the RF power ranges between 10-300 W, and the oxygen gas flow is larger than 20 standard cubic cm per minute (sccm). The wafer is placed at ambient temperature, and the reaction time is longer than 20 seconds. The bottom barrier layer 240b is exposed to the oxygen plasma, and oxygen atoms 510 diffuse into this top, exposed layer on the wafer 200. After oxygen plasma exposure, the second chemical solution containing ammonium ions is used to treat the bottom barrier layer 240b. The second chemical solution used in the two-stage oxidation does not contain oxidizing agent. Oxygen atoms 510 diffuse into the bottom barrier layer 240b the plasma treatment. Nitrogen atoms 520 are provided by the second chemical solution and diffuse into the bottom barrier layer 240b. The oxidized bottom barrier layer 240b' has an oxygen concentration ranging between approximately $1 \times 10^{18}$ to $1 \times 10^{21}$ atoms/cm$^3$, and the nitrogen concentration ranges between approximately $1 \times 10^{18}$ to $1 \times 10^{21}$ atoms/cm$^3$ as well. The oxygen concentration in the bottom barrier layer 240b' is higher than the nitrogen concentration.

In some embodiments of the instant disclosure, the oxidation involves using ozonated deionized water and the second chemical solution. The ozonated deionized water ($DIO_3$) has a high oxidation potential and generates an OH active radical during self-decomposition. The ozonated deionized water includes oxygen and oxygen radical in a concentration ranging between 10-100 ppm. The ozonated deionized water is sprayed onto the wafer, or the wafer is soaked in the ozonated deionized water. The reaction is taken at ambient temperature longer than approximately 30 seconds. During oxidation 500, the region 400 is treated with the ozonated deionized water, and oxygen atoms 510 diffuse into the bottom barrier layer 240b. After the exposure to ozonated deionized water condition, the second chemical solution containing ammonium ions is used. The reaction condition and period when using the second chemical solution is similar to the one used after oxygen plasma exposure. After ozonated deionized water exposure and treatment with the second chemical solution, the oxygen concentration in the bottom barrier layer 240b' ranges between approximately $1 \times 10^{18}$ to $1 \times 10^{21}$ atoms/cm$^3$, and the nitrogen concentration ranges between approximately $1 \times 10^{18}$ to $1 \times 10^{21}$ atoms/cm$^3$.

The oxidation process modifies the bottom barrier layer 240b' by introducing oxygen atoms 510 and nitrogen atoms 520 into the bottom barrier layer 240b'. The Ta—O dipole is created at the interface of the bottom barrier layer 240b' and the underlying high-κ dielectric layer 230. This Ta—O dipole creates an internal electrical potential, and the internal electrical potential results in the observed increased in effective work function.

Still referring to FIG. 9. The region 300 is well protected under the mask layer 250 during the oxidation process. Oxygen atoms or nitrogen atoms are not intentionally introduced into the bottom barrier layer 240a at the region 300. A differentiation of threshold voltage is then created between the regions 300 and 400 because the treated bottom barrier layer 240b' has a higher effective work function by at least 30 meV in comparison with the untreated bottom barrier layer 240a. The nitrogen and oxygen concentration in the bottom barrier layer 240b' is also at least 5% higher than that of the untreated bottom barrier layer 240a. The sidewalls and bottom surface of the recess 405 is lined with the high-κ dielectric layer 230 and the treated bottom barrier layer 240b'.

Figure 10:
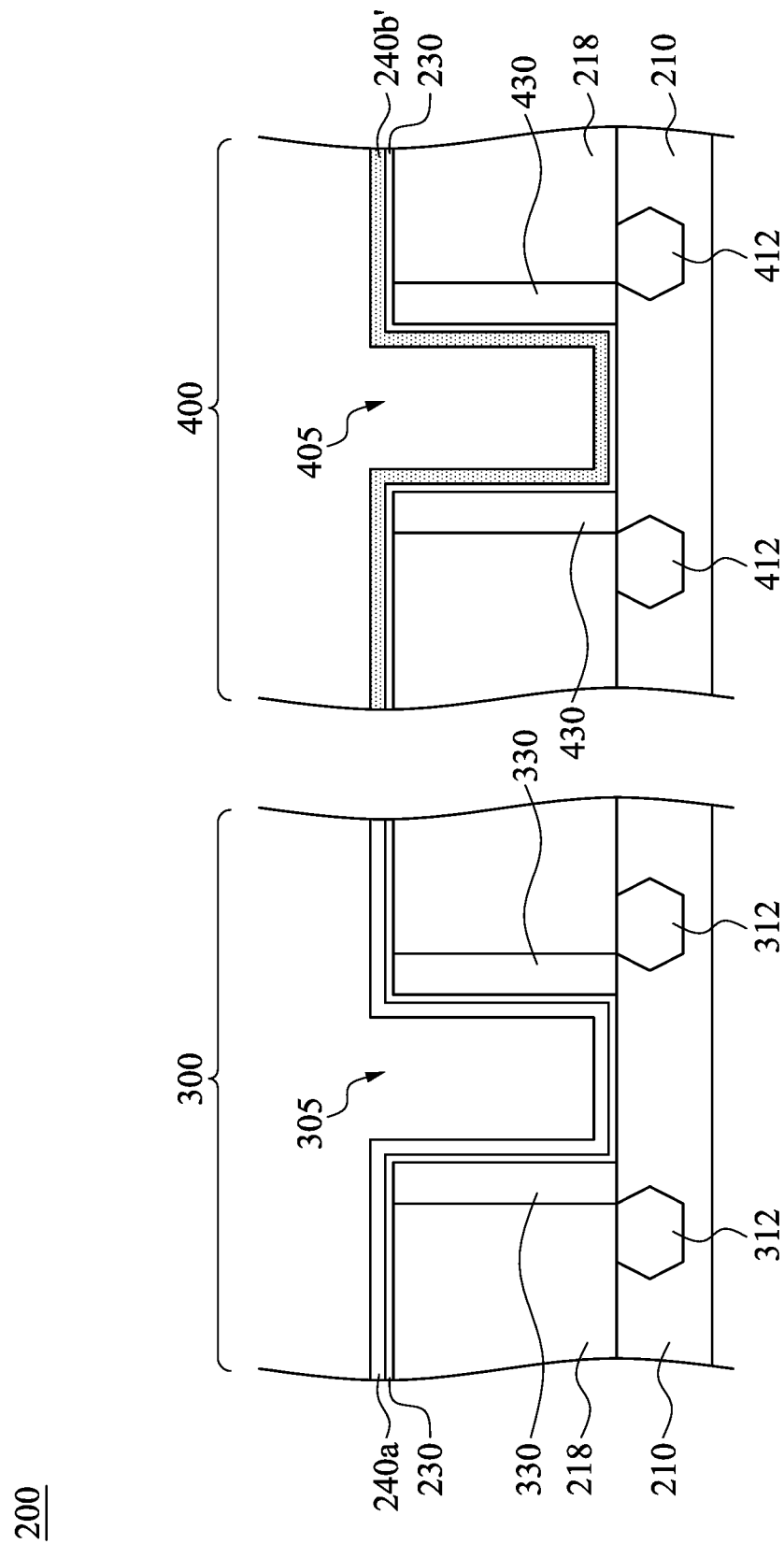

Attention is now invited to FIG. 10. The mask layer 250 is removed from the wafer 200 by any suitable etching process. The recesses 305 and 405 are then exposed. The recesses 305 and 405 are both lined with high-κ dielectric layer 230 and the bottom barrier layers 240a, 240b'. The difference between regions 300 and 400 arises from the electrical property. The treated bottom barrier layer 240b' contributes to the an increase of the effective work function in the region 400, by at least 30 meV, while this increase is not provided by the untreated bottom barrier layer 240a. The recesses 305 and 405 may have similar configuration, but the effective work function is no longer the same after oxidation. The effective work function is tuned without increasing the thickness.

Figure 11:
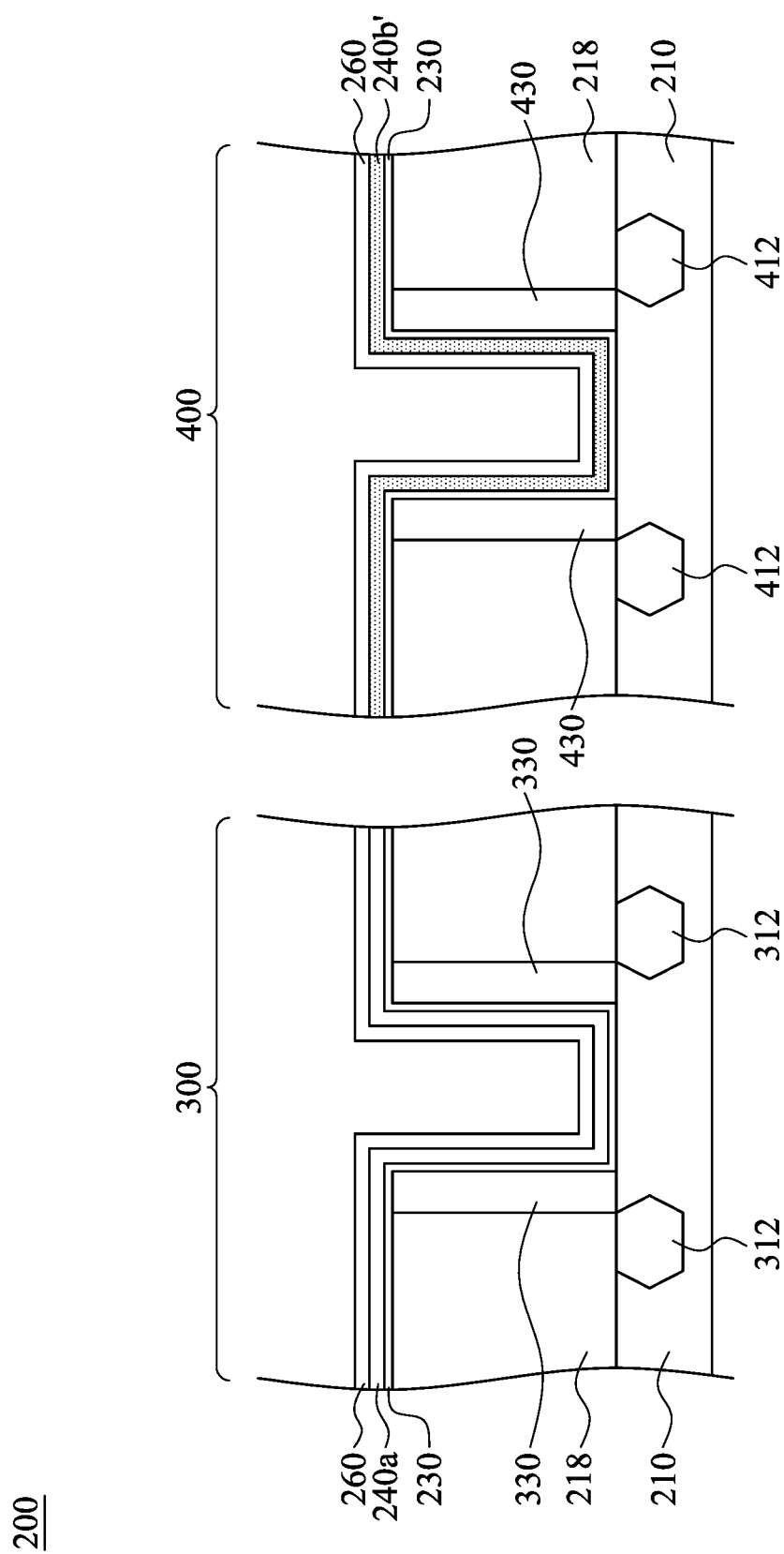

Reference is made to FIG. 11. A work function metal layer 260 is formed on the semiconductor substrate 210. The work function metal layer 260 is deposited in the recesses 305, 405. The work function metal layer 260 follows the contour of the bottom surfaces and sidewalls of the recesses 305, 405 and top surfaces of the spacers 330, 430 and the ILD layer 218. The work function metal layer(s) 260 is in direct contact with the bottom barrier layers 240a, 240b'. The work function metal layer 260 may include Ti, TiN, TiAl, Al, and TiAlW or any other suitable materials. The work function metal layer 260 may be deposited by, for example, CVD, plasma-enhanced CVD (PECVD), sputtering, ion beam, spin on, physical vapor deposition (PVD), ALD or the like. The work function metal layer 260 may include one or more layers with the same or different materials.

Figure 12:
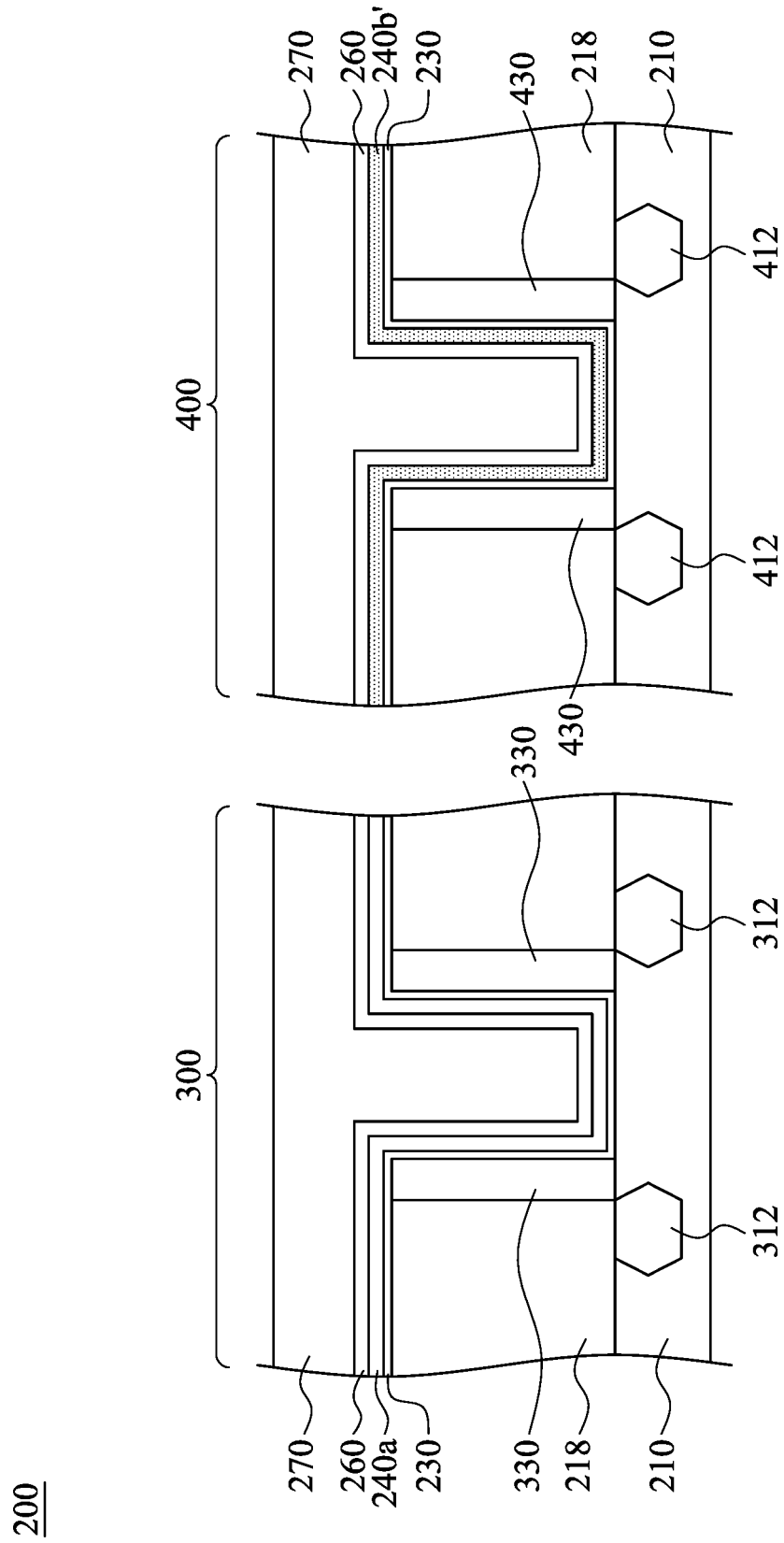

Reference is made to FIG. 12. A filling metal 270 is deposited over the wafer 200. The filling metal 170 fills in the remaining portion of the recesses 305, 405 and overfills the recesses 305, 405 to cover up the work function metal layer 260 on the top surfaces of the spacers 330, 430 and the ILD layer 218. A material of the filling metal 270 may include, for example, tungsten (W). The filling metal 270 occupies similar volume in the recesses 305, 405 because the recesses 305, 405 have the same number of layers on the bottom surfaces and sidewalls. The gate structure in the regions 300, 400 are similar, while the treated bottom barrier layer 240b' contributes to the increase of effective work function in the region 400. The regions 300, 400 therefore have different effective work functions but nearly the same configuration.

Figure 13:
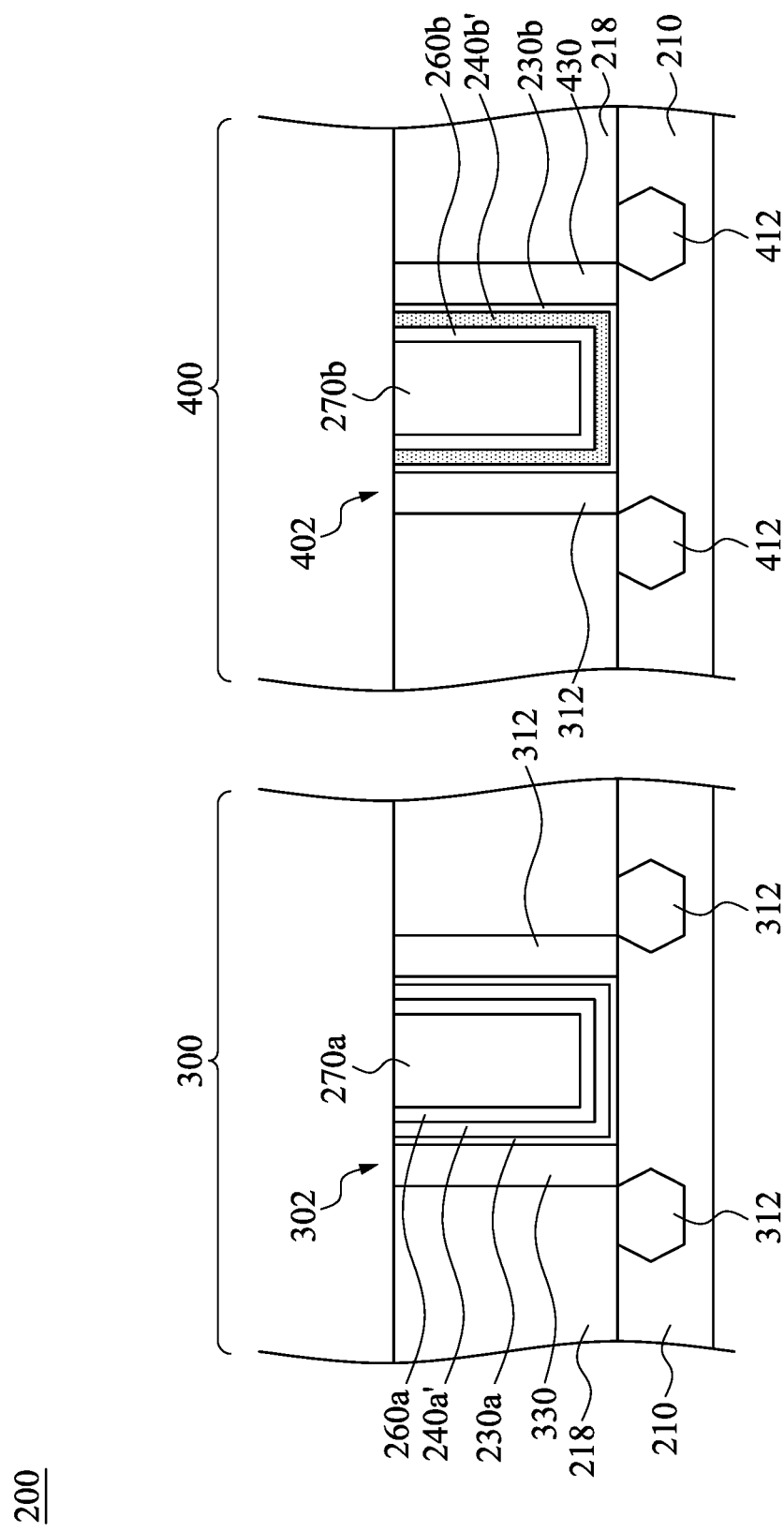

Reference is made to FIG. 13. An etching back is performed to bring down the filling metal 270, the work function metal layer 260, the bottom barrier layers 240a, 240b', and the high-κ dielectric layer 230 within the recesses 305 and 405. The filling metals 270a, 270b are lowered to a level coplanar with the inter-level dielectric layer 218. The work function metal layer 260, the bottom barrier layers 240a, 240b', and the high-κ dielectric layer 230 on the inter-level dielectric layer 218 are removed. Edges of the work function metal layers 260a, 260b, the bottom barrier layers 240a, 240b' and the high-κ dielectric layers 230a, 230b are substantially coplanar with the inter-level dielectric layer 218. As a result, the filling metals 270a, 270b are wrapped around by the work function metal layers 260a, 260b from three sides. The work function metal layers 260a, 260b have a cross-section resembles the shape of U.

Still referring to FIG. 13. The wafer 200 includes a semiconductor substrate 210 and a plurality of gate structures 302, 402. The gate structures 302, 402 are defined by sidewall spacers 330, 430. Source/drain regions 312, 412 are formed in the substrate 210 adjacent to the sidewall spacers 330, 430. The high-κ dielectric layers 230a, 230b line the sidewalls of the sidewall spacers 330, 430 and cover the surface of the semiconductor substrate 210. The high-κ dielectric layers 230a, 230b have a cross-section resembles the shape of U. The bottom barrier layers 240a, 240b' are conformally disposed on the high-κ dielectric layers 230a, 230b. The bottom barrier layer 240b' undergoes oxidation process. Oxygen atoms and nitrogen atoms are introduced into the bottom barrier layer 240b' in a concentration ranging between approximately $1\times10^{18}$ to $1\times10^{21}$ atoms/cm$^3$. The oxygen concentration is higher than the nitrogen concentration. The oxygen atoms and nitrogen atoms may be provided by a chemical solution containing oxidizing agent and ammonium ions, or oxygen plasma followed by a chemical solution containing ammonium ions, or further still ozonated deionized water followed by a chemical solution containing ammonium ions. Typically, a work function metal layer of an NMOS gate structure has a work function ranging between about 3.8 eV and 4.6 eV. The nitrogen and oxygen concentration in the treated bottom barrier layer 240b' exhibits at least 5% higher than that in the untreated bottom barrier layer 240a. In addition, the treated bottom barrier layer 240b' has a higher oxygen concentration than its nitrogen concentration. In general, the treated bottom barrier layer 240b' exhibits elevated effective work function by at least 30 meV in comparison with untreated bottom barrier layer 240a. This elevated effective work function results from the dipole moment between the bottom barrier layer and the underlying high-κ dielectric layer. The effective work function in different types of gate structures can be modulated without increasing the thickness of the work function metal layer. The work function metal layers 260a, 260b are conformally disposed on the bottom barrier layers 240a, 240b'. The filling metal 270a, 270b fill in the remaining portion between the sidewall spacers 330, 430.

The gate structures on one wafer may be of different types of devices and require different effective work functions. By introducing oxygen atoms and nitrogen atoms into the bottom barrier layer to a predetermined concentration, the effective work function can be modulated without adding multiple layers of work function metal layers. The gate structures remain uniform, while the effective work function can be finely tuned by treating the bottom barrier layer.

An NMOS transistor gate structure includes at least one spacer defining a gate region over a semiconductor substrate, a gate dielectric layer disposed on the gate region and lining an inner sidewall of the spacer, a bottom barrier layer conformally disposed on the gate dielectric layer, a work function metal layer disposed on the bottom barrier layer, and a filling metal partially wrapped by the work function metal layer. The bottom barrier layer has an oxygen concentration higher than a nitrogen concentration.

A method of manufacturing NMOS gate structure includes forming at least one dummy gate stack. An inter-layer dielectric (ILD) layer is formed around the dummy gate stack. The dummy gate stack is removed to form at least one recess. A gate dielectric layer is formed on a bottom surface and sidewalls of the recess. A bottom barrier layer is formed on the gate dielectric layer. A portion of the bottom barrier layer is oxidized. The portion of the oxidized bottom barrier layer has a nitrogen and oxygen concentration 5% higher than the remaining portion of the bottom barrier layer.

A work function metal layer is formed on the bottom barrier layer. A remaining portion of the recess is filled with a filling metal.

A method of manufacturing NMOS gate structure includes forming at least one dummy gate stack. An inter-layer dielectric (ILD) layer is formed around the dummy gate stack. The dummy gate stack is removed to form at least one recess. A gate dielectric layer is formed on a bottom surface and sidewalls of the recess. A bottom barrier layer is formed on the gate dielectric layer. A portion of the bottom barrier layer is oxidized. A work function metal layer is formed on the bottom barrier layer. A remaining portion of the recess is filled with a filling metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing NMOS gate structure, comprising:
   forming at least one dummy gate stack;
   forming an inter-layer dielectric (ILD) layer around the dummy gate stack;
   removing the dummy gate stack to form at least one recess;
   forming a gate dielectric layer on a bottom surface and sidewalls of the recess;
   forming a bottom barrier layer on the gate dielectric layer;
   oxidizing a portion of the bottom barrier layer, wherein the oxidized portion of the bottom barrier layer has a nitrogen concentration and an oxygen concentration higher than the remaining portion of the bottom barrier layer;
   forming a work function metal layer on the bottom barrier layer; and
   filling a remaining portion of the recess with a filling metal.

2. The method of claim 1, wherein before oxidizing the portion of the bottom barrier layer comprises:
   depositing a mask layer on the bottom barrier layer; and
   patterning the mask layer to expose the portion of the bottom barrier layer.

3. The method of claim 1, wherein oxidizing the portion of the bottom barrier layer comprises:
   treating the bottom barrier layer with a chemical solution containing an oxidizing agent and ammonium ions.

4. The method of claim 3, wherein the oxidizing agent comprises $H_2O_2$.

5. The method of claim 3, wherein the oxidizing agent comprises an acid with $ClO_3^-$, $ClO^-$, or $NO_3^-$.

6. The method of claim 1, wherein oxidizing the portion of the bottom barrier layer comprises:
   exposing the bottom barrier layer to ozonated deionized water; and
   treating the bottom barrier layer with a chemical solution containing ammonium ions.

7. The method of claim 1, wherein the bottom barrier layer includes a material selected from Ta, TaN, TaTi, TaTiN and a combination thereof.

8. The method of claim 1, wherein the oxygen concentration is higher than the nitrogen concentration at the portion of the bottom barrier layer.

9. A method of manufacturing metal gate structure, the method comprising:
   forming a gate dielectric layer;
   forming a bottom barrier layer on the gate dielectric layer;
   oxidizing a portion of the bottom barrier layer, wherein the oxidized portion of the bottom barrier layer has a nitrogen concentration and an oxygen concentration higher than a nitrogen concentration and an oxygen concentration in the remaining portion of the bottom barrier layer; and;
   forming a metal layer on the bottom barrier layer.

10. The method of claim 9, wherein before oxidizing the portion of the bottom barrier layer comprises:
    depositing a mask layer on the bottom barrier layer; and
    patterning the mask layer to expose the portion of the bottom barrier layer.

11. The method of claim 9, wherein oxidizing the portion of the bottom barrier layer comprises:
    treating the bottom barrier layer with a chemical solution containing an oxidizing agent and ammonium ions.

12. The method of claim 11, wherein the oxidizing agent comprises $H_2O_2$.

13. The method of claim 11, wherein the oxidizing agent comprises an acid with $ClO_3^-$, $ClO^-$, or $NO_3^-$.

14. The method of claim 9, wherein oxidizing the portion of the bottom barrier layer comprises:
    exposing the bottom barrier layer to ozonated deionized water; and
    treating the bottom barrier layer with a chemical solution containing ammonium ions.

15. The method of claim 9, wherein oxidizing the portion of the bottom barrier layer comprises:
    exposing the bottom barrier layer to oxygen plasma; and
    treating the bottom barrier layer with a chemical solution containing ammonium ions.

16. A method, comprising:
    forming a gate dielectric layer over a substrate;
    forming a tantalum-containing layer over the gate dielectric layer;
    treating a portion of the tantalum-containing layer with oxygen to form a Ta—O dipole-containing layer, wherein the treated portion of the tantalum-containing layer has a nitrogen concentration and an oxygen concentration higher than a nitrogen concentration and an oxygen concentration in an untreated portion of the tantalum-containing layer; and
    forming a metal layer over the Ta—O dipole-containing layer.

17. The method of claim 16, wherein the treating the tantalum-containing layer with the oxygen is performed using a chemical solution containing oxidizing agent.

18. The method of claim 16, wherein the treating the tantalum-containing layer with the oxygen is performed using a plasma containing oxygen.

19. The method of claim 16, further comprising treating the tantalum-containing layer with nitrogen.

20. The method of claim 19, wherein the treating the tantalum-containing layer with the nitrogen is performed using a chemical solution containing ammonium ions.

* * * * *